(12) United States Patent
Shimazaki et al.

(10) Patent No.: US 6,700,144 B2
(45) Date of Patent: Mar. 2, 2004

(54) SEMICONDUCTOR DEVICE AND METHOD FOR MANUFACTURING THE SAME

(75) Inventors: Toyoyuki Shimazaki, Osaka (JP); Katuichi Ohsawa, Osaka (JP); Tetsuo Chato, Katano (JP); Yuzo Shimizu, Mishima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/155,470

(22) Filed: May 24, 2002

(65) Prior Publication Data

US 2002/0182801 A1 Dec. 5, 2002

(30) Foreign Application Priority Data

May 30, 2001 (JP) ........................................ 2001-163204

(51) Int. Cl.[7] .......................... H01L 31/062; H01L 21/00
(52) U.S. Cl. ....................... 257/292; 257/290; 257/293; 257/431; 257/458; 257/499; 438/59; 438/202; 438/145
(58) Field of Search ................................. 257/430, 431, 257/446, 458, 499, 525, 565, 290, 291, 292, 293, 184, 187; 438/59, 60, 73, 75, 85, 144, 145, 202, 234, 499, 565

(56) References Cited

U.S. PATENT DOCUMENTS

| | | | | |
|---|---|---|---|---|
| 4,450,466 A | * | 5/1984 | Nishizawa et al. | ......... 257/292 |
| 4,611,223 A | * | 9/1986 | Hine et al. | ................... 257/446 |
| 5,296,731 A | * | 3/1994 | Morikawa | ................... 257/546 |
| 5,401,999 A | * | 3/1995 | Bayraktaroglu | .............. 257/458 |
| 5,463,238 A | * | 10/1995 | Takahashi et al. | ........... 257/351 |
| 5,719,414 A | | 2/1998 | Sato et al. | |
| 6,028,344 A | * | 2/2000 | Hashimoto | ................... 257/587 |
| 6,215,155 B1 | * | 4/2001 | Wollesen | ...................... 257/351 |
| 6,333,544 B1 | * | 12/2001 | Toyoda et al. | ............... 257/431 |
| 6,380,037 B1 | * | 4/2002 | Osanai | ......................... 438/294 |
| 6,448,614 B2 | * | 9/2002 | Kubo et al. | ................... 257/347 |
| 6,573,578 B2 | * | 6/2003 | Kimura et al. | ............... 257/431 |

FOREIGN PATENT DOCUMENTS

| | | | | |
|---|---|---|---|---|
| JP | 7-240534 | | 9/1995 | |
| JP | 2000040758 A | * | 2/2000 | ........ H01L/21/8249 |

* cited by examiner

Primary Examiner—Matthew Smith
Assistant Examiner—Lex H. Malsawma
(74) Attorney, Agent, or Firm—Merchant & Gould P.C.

(57) ABSTRACT

A semiconductor device includes the following: a semiconductor substrate of a first conduction type; an intrinsic semiconductor layer of the first conduction type formed on the semiconductor substrate; a first semiconductor layer of a second conduction type formed on the intrinsic semiconductor layer; a first impurity layer of the first conduction type formed in the first semiconductor layer of the second conduction type; and a bipolar transistor and a MIS transistor formed in the first semiconductor layer of the second conduction type. The laminated structure of the semiconductor substrate, the intrinsic semiconductor layer, and the first semiconductor layer provides a diode for photoelectric conversion. A first insulator layer and a second insulator layer are formed respectively in at least a portion below the bipolar transistor and the MIS transistor. The transistors are isolated from the semiconductor substrate by the insulator layers, so that the characteristics of the transistors can be adjusted independently of the diode.

26 Claims, 13 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device including a photoelectric conversion portion and a transistor for signal processing and to a method for manufacturing the semiconductor device.

2. Description of the Related Art

Figure 6:
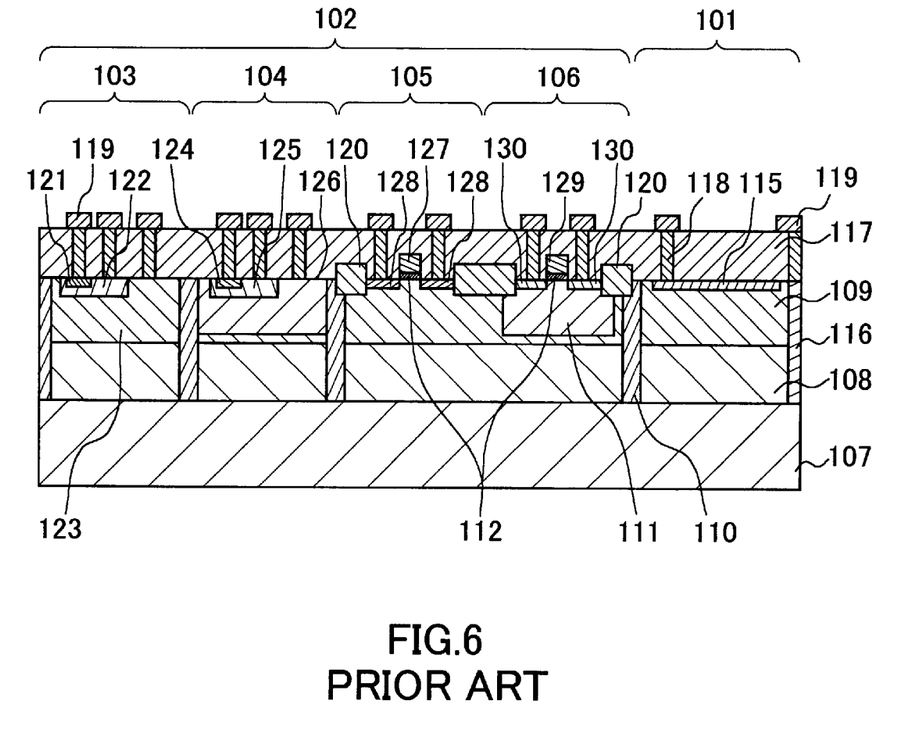
FIG. 6 is a cross-sectional view showing the configuration of a conventional semiconductor device.

FIG. 6 shows an example of a conventional photoelectric conversion semiconductor device. In FIG. 6, reference numeral 101 denotes a photoelectric conversion portion, and 102 denotes a control portion that controls a signal obtained by photoelectric conversion.

Reference numeral 107 denotes a first conduction type semiconductor substrate. The semiconductor substrate 107 is made of silicon whose impurity concentration is adjusted to about $1 \times 10^{20}$ atms/cm$^3$ by including boron as P-type impurities. Reference numeral 108 denotes a first conduction type intrinsic semiconductor layer (hereinafter, also referred to as I layer). The intrinsic semiconductor layer 108 is formed on the semiconductor substrate 107 with silicon that includes boron as P-type impurities in a concentration of about $1 \times 10^{12}$ atms/cm$^3$ to $1 \times 10^{13}$ atms/cm$^3$. Reference numeral 109 denotes a second conduction type layer. The second conduction type layer 109 is formed on the intrinsic semiconductor layer 108 with silicon whose impurity concentration is adjusted by including phosphorus as N-type impurities. This continuous structure of P-type layer—I layer—N-type layer constitutes a PIN diode for photoelectric conversion. A second conduction type diffusion layer 115 is used as an anode, and a first conduction type diffusion layer 116 is used as a cathode.

The control portion 102 includes a NPN bipolar transistor 103, a PNP bipolar transistor 104, a P-channel MIS transistor 105, and a N-channel MIS transistor 106.

Reference numeral 110 denotes a diffusion isolation region, which separates the photoelectric conversion portion 101 and the control portion 102 by a PN junction, and further separates the NPN bipolar transistor 103 and the PNP bipolar transistor 104.

In the NPN bipolar transistor 103, a collector 123 is formed in the second conduction type layer 109, a base 122 is formed by using boron as impurities, and an emitter 121 is formed by using arsenic as impurities.

In the PNP bipolar transistor 104, a collector 126 is formed by using boron as impurities, a base 125 is formed by using phosphorus as impurities, and an emitter 124 is formed by using boron as impurities.

In the P-channel MIS transistor 105, a source/drain 128 is formed by using boron as P-type impurities. A gate insulating film 112 is formed with a silicon oxide film. A gate electrode 127 is formed on the gate insulating film 112 with polycrystalline silicon that includes phosphorus as N-type impurities.

In the N-channel MIS transistor 106, a P-type impurity region 111 is formed by using boron as P-type impurities. A source/drain 130 is formed in the P-type impurity region 111 by using arsenic as N-type impurities. A gate insulating film 112 is formed with a silicon oxide film. A gate electrode 129 is formed on the gate insulating film 112 with polycrystalline silicon that includes phosphorus as N-type impurities.

Reference numeral 120 denotes an insulator isolation portion, which separates the N-channel MIS transistor 106 and the P-channel MIS transistor 105 by a silicon oxide film.

In this photoelectric conversion semiconductor device, current generated by light entering the photoelectric conversion portion 101 is taken out of the cathode electrode 116, and then converted into a signal by a circuit that is formed as a combination of the NPN bipolar transistor 103, the PNP bipolar transistor 104, the N-channel MIS transistor 106, the P-channel MIS transistor 105, and the like.

In a data reading apparatus for an optical disk such as a compact disk, the market demand for high-speed reading of the optical disk has grown recently. A photoelectric conversion device that converts an optical signal into an electric signal is used in a read portion of the data reading apparatus. Therefore, the achievement of high-frequency property of the photoelectric conversion device is indispensable for meeting the market demand. In the conventional photoelectric conversion device in FIG. 6, P-type impurities contained in the semiconductor substrate 107 diffuse to the side of the intrinsic semiconductor layer 108 during the manufacturing process, and a portion in which the impurity profile changes gradually is formed at the contact portion between the semiconductor substrate 107 and the intrinsic semiconductor layer 108. Therefore, in addition to the current that is generated due to carriers in a depletion layer when light enters, a current component is produced due to a diffusion of carriers generated in the portion of impurity profile gradient into the depletion layer after a delay. Consequently, time resolution is reduced.

To achieve a photoelectric conversion device with a good high frequency property, a measure for improving the response characteristics of the PIN diode has been employed, e.g., by adjusting the concentration of the first impurity in the semiconductor substrate 107, the thickness of the intrinsic semiconductor layer 108, and the thickness of the second impurity layer 109, or a measure for reducing a wiring resistance component has been employed.

Though these measures are effective in improving the high frequency property of the PIN diode, they have an adverse effect on the characteristics of the bipolar transistors and MIS transistors in the control portion 102. Examples of such an adverse effect include a degradation of the element isolation property, such as leakage current and a decrease of withstand voltage, at the PN junctions between the collector of the bipolar transistor and the semiconductor substrate 107 and between the source and drain of the MIS transistor and the semiconductor substrate 107, an increase in parasitic capacitance, and the formation of a parasitic transistor. This leads to a decrease in the level of a converted electric signal by the photoelectric conversion portion, which in turn causes degradation of performance, such as processing accuracy and processing speed, for the signal processing portion and a reduction in yield.

SUMMARY OF THE INVENTION

It is an object of the present invention to provide a semiconductor device that can form bipolar transistors and MIS transistors for signal processing and adjust the characteristics of the transistors easily without being affected by the conditions of formation of a PIN diode for photoelectric conversion, such as the impurity concentration of a semiconductor substrate and the thickness of an intrinsic semiconductor layer, and a method for manufacturing the semiconductor device.

A semiconductor device of the present invention includes the following: a semiconductor substrate of a first conduction type; an intrinsic semiconductor layer of the first conduction type formed on the semiconductor substrate, the intrinsic semiconductor layer having a lower impurity concentration than that of the semiconductor substrate; a first semiconductor layer of a second conduction type formed on the intrinsic semiconductor layer; a first impurity layer of the first conduction type formed in the first semiconductor layer of the second conduction type; and a bipolar transistor and a MIS transistor formed in the first semiconductor layer of the second conduction type. The laminated structure of the semiconductor substrate, the intrinsic semiconductor layer, and the first semiconductor layer provides a diode for photoelectric conversion. A first insulator layer is formed in at least a portion below the bipolar transistor and a second insulator layer is formed in at least a portion below the MIS transistor.

According to this configuration, the insulator layers are formed respectively below the bipolar transistor and the MIS transistor, so that the transistors can be isolated electrically from the semiconductor substrate. This leads to improvements in the performance of the transistors and in the characteristics of the PIN diode. Therefore, a high-performance PIN diode can be achieved to make it easier to provide a photoelectric conversion device with high-frequency property, which increases the yield of the photoelectric conversion device.

A method for manufacturing a semiconductor device of the present invention includes the following: forming an intrinsic semiconductor layer of a first conduction type on a semiconductor substrate of the first conduction type, the intrinsic semiconductor layer having a lower impurity concentration than that of the semiconductor substrate; forming a first semiconductor layer of a second conduction type on the intrinsic semiconductor layer; forming a first impurity layer of the first conduction type in the first semiconductor layer of the second conduction type; forming a bipolar transistor in a portion of the first semiconductor layer of the second conduction type, the bipolar transistor including a collector diffusion layer, a base diffusion layer, and an emitter diffusion layer; and forming a MIS transistor in a portion of the first semiconductor layer of the second conduction type, the MIS transistor including a source diffusion layer and a drain diffusion layer. The laminated structure of the semiconductor substrate, the intrinsic semiconductor layer, and the first semiconductor layer provides a diode for photoelectric conversion. A first insulator layer is formed in at least a portion below the bipolar transistor and a second insulator layer is formed in at least a portion below the MIS transistor.

DESCRIPTION OF THE PREFERRED EMBODIMENTS

Embodiment 1

Figure 1:
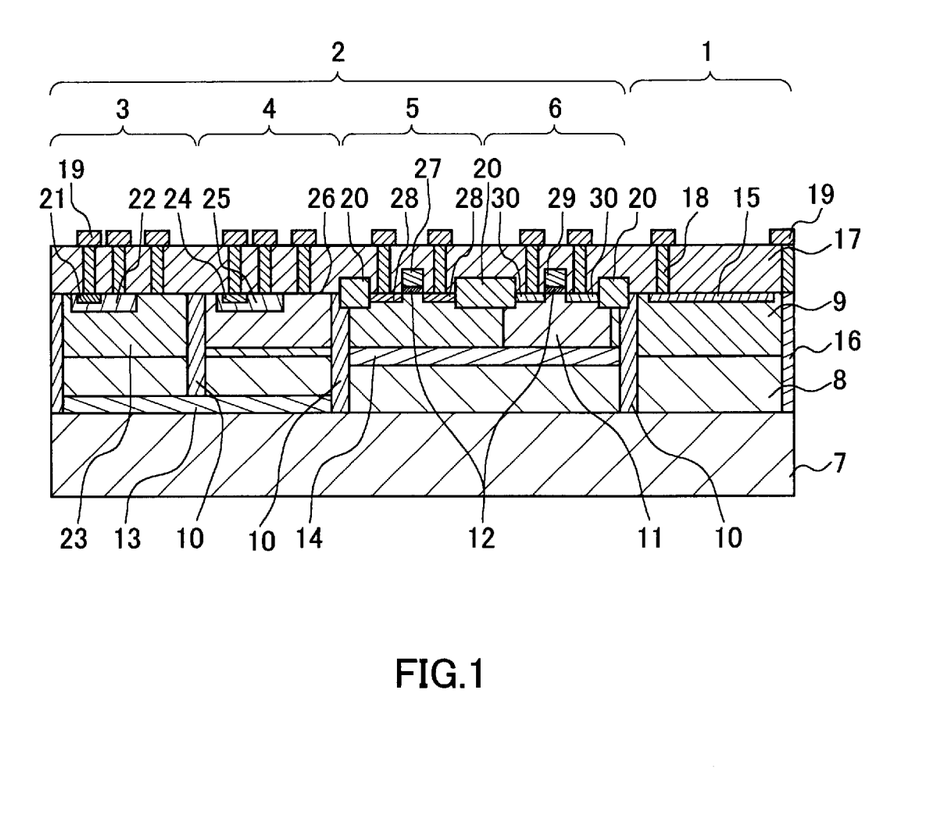
FIG. 1 is a cross-sectional view showing the configuration of a semiconductor device of Embodiment 1.

FIG. 1 is a cross-sectional view showing an example of a semiconductor device according to Embodiment 1 of the present invention. Reference numeral 1 denotes a photoelectric conversion portion, and 2 denotes a control portion that controls a signal obtained by photoelectric conversion. The control portion 2 is formed as a combination of a NPN bipolar transistor 3, a PNP bipolar transistor 4, a P-channel MIS transistor 5, and a N-channel MIS transistor 6.

Reference numeral 7 denotes a first conduction type semiconductor substrate. The semiconductor substrate 7 functions as a cathode and is made of silicon whose impurity concentration is adjusted to about $1 \times 10^{20}$ atms/cm$^3$ by including boron as P-type impurities. Reference numeral 8 denotes a first conduction type intrinsic semiconductor layer (hereinafter, also referred to as I layer). The intrinsic semiconductor layer 8 is formed on the semiconductor substrate 7 with silicon that includes boron in a concentration of about $1 \times 10^{12}$ atms/cm$^3$ to $1 \times 10^{13}$ atms/cm$^3$. Reference numeral 9 denotes a second conduction type layer. The second conduction type layer 9 is formed on the intrinsic semiconductor layer 8 with silicon whose impurity concentration is adjusted by including phosphorus as N-type impurities in a concentration of about $1 \times 10^{15}$ atms/cm$^3$ to $1 \times 10^{20}$ atms/cm$^3$. A second conduction type diffusion layer 15 is formed by introducing arsenic to reduce the surface resistance for an anode. This continuous structure of P-type layer—I layer—N-type layer constitutes a PIN diode for photoelectric conversion. A first conduction type diffusion layer 16 is formed with boron so as to conduct a potential from the cathode. The control portion 2 controls a photoelectrically converted signal that is taken out of the first conduction type diffusion layer 16.

In the NPN bipolar transistor 3, a collector 23 is formed in the second conduction type layer 9 by using phosphorus as impurities, a base 22 is formed by using boron as impurities, and an emitter 21 is formed by using arsenic as impurities.

In the PNP bipolar transistor 4, a collector 26 is formed by using boron as impurities, a base 25 is formed by using phosphorus as impurities, and an emitter 24 is formed by using boron as impurities.

Reference numeral 10 denotes diffusion isolation regions, by which a PN junction is formed by using boron as P-type impurities. The diffusion isolation regions 10 separate the photoelectric conversion portion 1, the NPN bipolar transistor 3, and the PNP bipolar transistor 4.

In the P-channel MIS transistor 5, a source/drain 28 is formed in the second conduction type layer 9 by using boron as P-type impurities. A gate insulating film 12 is formed with a silicon oxide film. A gate electrode 27 is formed on the gate insulating film 12 with polycrystalline silicon that includes phosphorus as N-type impurities.

In the N-channel MIS transistor 6, a P-type impurity region 11 is formed by using boron as P-type impurities. A source/drain 30 is formed in the P-type impurity region 11 by using arsenic as N-type impurities. A gate insulating film 12 is formed with a silicon oxide film. A gate electrode 29 is formed on the gate insulating film 12 with polycrystalline silicon that includes phosphorus as N-type impurities.

Reference numeral 20 denotes insulator isolation portions formed with a silicon oxide film, which separate the N-channel MIS transistor 5 and the P-channel MIS transistor 6.

Reference numeral 13 denotes a first insulator layer, which is formed with a silicon oxide film below the NPN bipolar transistor 3 and the PNP bipolar transistor 4. The first insulator film 13 is formed in both the semiconductor substrate 7 and the intrinsic semiconductor layer 8 or may be formed in the intrinsic semiconductor layer 8 alone.

Reference numeral 14 denotes a second insulator layer, which is formed with a silicon oxide film below the P-channel MIS transistor 5 and the N-channel MIS transistor 6. The second insulator layer 14 is formed in both the intrinsic semiconductor layer 8 and the second conduction type layer 9 or may be formed in either of the layers.

Reference numeral 17 denotes an interlayer insulating film formed with a silicon oxide film, 18 denotes a connection hole, and 19 denotes an aluminum electrode.

In the semiconductor device of Embodiment 1, current generated by light entering the photoelectric conversion portion 1 is taken out of the cathode electrode 16, and then converted into a signal by a circuit that is formed as a combination of the NPN bipolar transistor 3, the PNP bipolar transistor 4, the P-channel MIS transistor 5, the N-channel MIS transistor 6, and the like.

Next, an example of a method for manufacturing a semiconductor device having the above configuration will be described by referring to FIGS. 2A to 2J. FIGS. 2A to 2J are cross-sectional views showing the process flow.

Figure 2A:
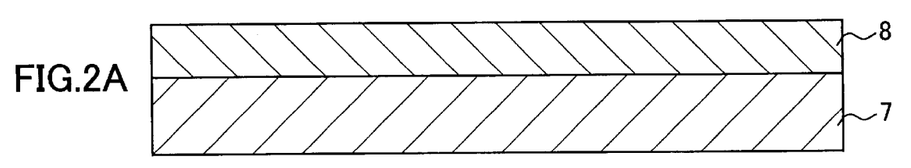
FIGS. 2A to 2J are cross-sectional views showing the process flow of a method for manufacturing the semiconductor device of Embodiment 1.

First, the semiconductor substrate 7 in FIG. 2A is adjusted to be the first conduction type. A silicon substrate is used and its impurity concentration is adjusted to about $1 \times 10^{20}$ atms/cm$^3$ of boron as P-type impurities. The first conduction type intrinsic semiconductor layer 8 is formed on the semiconductor substrate 7 with silicon that includes boron in a concentration of about $1 \times 10^{12}$ atms/cm$^3$ to $1 \times 10^{13}$ atms/cm$^3$.

Figure 2B:
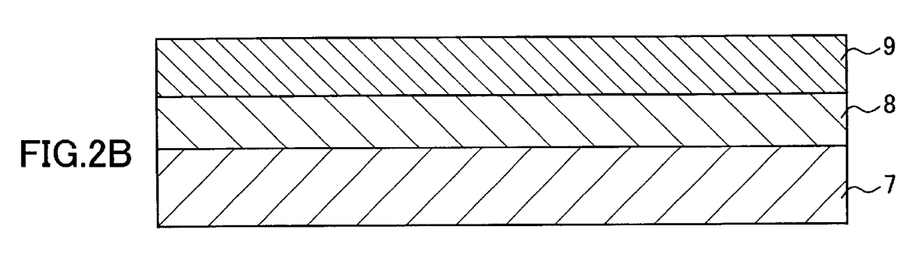

As shown in FIG. 2B, single crystal silicon is deposited on the intrinsic semiconductor layer 8 by an epitaxial process that uses silane gas, to which phosphorus is added as impurities in a concentration of about $1 \times 10^{15}$ atms/cm$^3$ to $1 \times 10^{20}$ atms/cm$^3$ to achieve a N-type conduction (the second conduction type), thus producing the second conduction type layer 9.

Figure 2C:
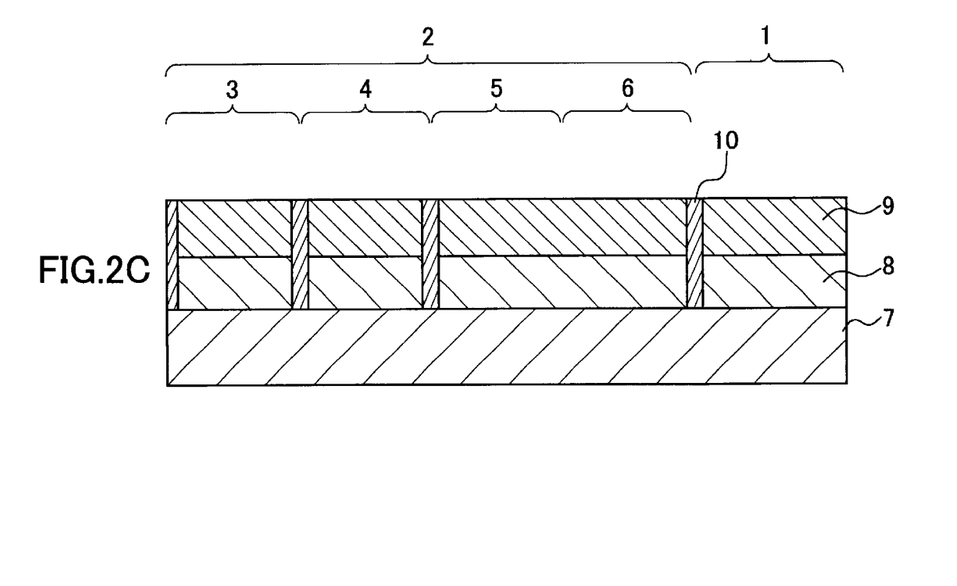

As shown in FIG. 2C, the diffusion isolation regions 10 are formed in the second conduction type layer 9 and the intrinsic semiconductor layer 8 by using boron as P-type impurities. The diffusion isolation regions 10 have a different conduction type from the second conduction type and function as PN-junction type element-isolation layers. In FIGS. 2C to 2J, the respective regions where the photoelectric conversion portion 1, the control portion 2, the NPN bipolar transistor 3, the PNP bipolar transistor 4, the P-channel MIS transistor 5, and the N-channel MIS transistor 6 are formed are represented by the corresponding reference numerals.

Figure 2D:
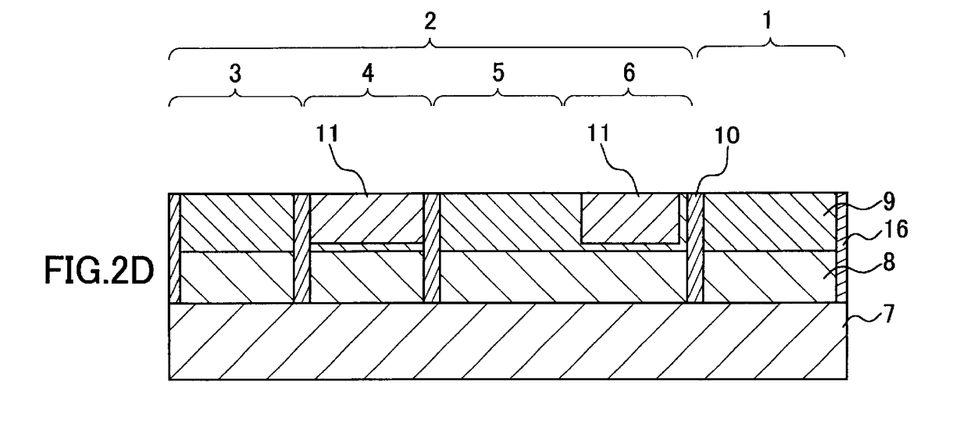

As shown in FIG. 2D, the P-type impurity regions 11 are formed by using boron as impurities, where the collector of the PNP bipolar transistor 4 and the N-channel MIS transistor 6 are to be formed. Moreover, the first conduction type diffusion layer 16 is formed to function as the cathode of the photoelectric conversion portion 1.

Figure 2E:
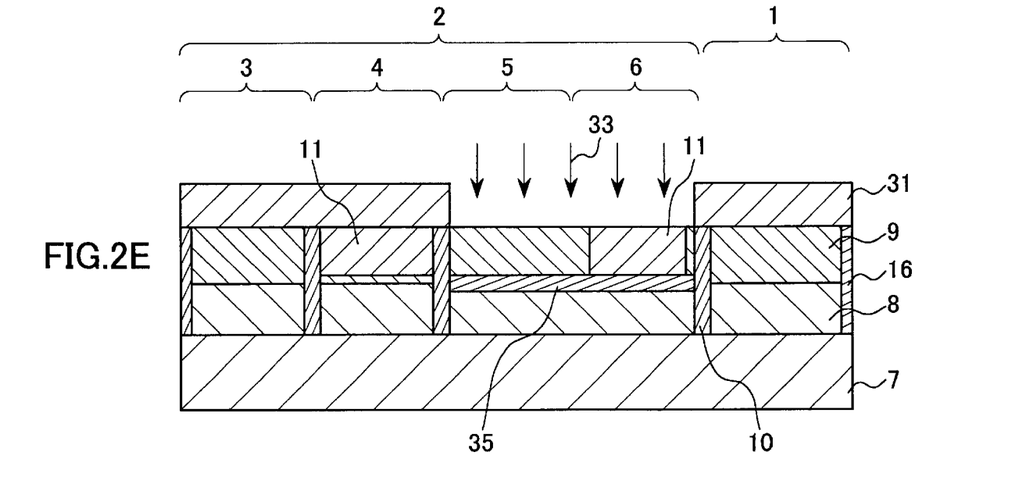

As shown in FIG. 2E, a first mask pattern 31 is formed on the second conduction type layer 9 by a photoresist or the like. The first mask pattern 31 is provided with an opening for ion implantation into the entire P-channel MIS transistor 5 and N-channel MIS transistor 6 or into a portion of the MIS transistors. A first ion implantation 33 is performed selectively with the first mask pattern 31 to form a first oxygen ion implanted region 35. At this time, the acceleration energy of the first ion implantation 33 is adjusted so that the first oxygen ion implanted region 35 is formed in both the intrinsic semiconductor layer 8 and the second conduction type layer 9 or in either of the layers.

Figure 2F:
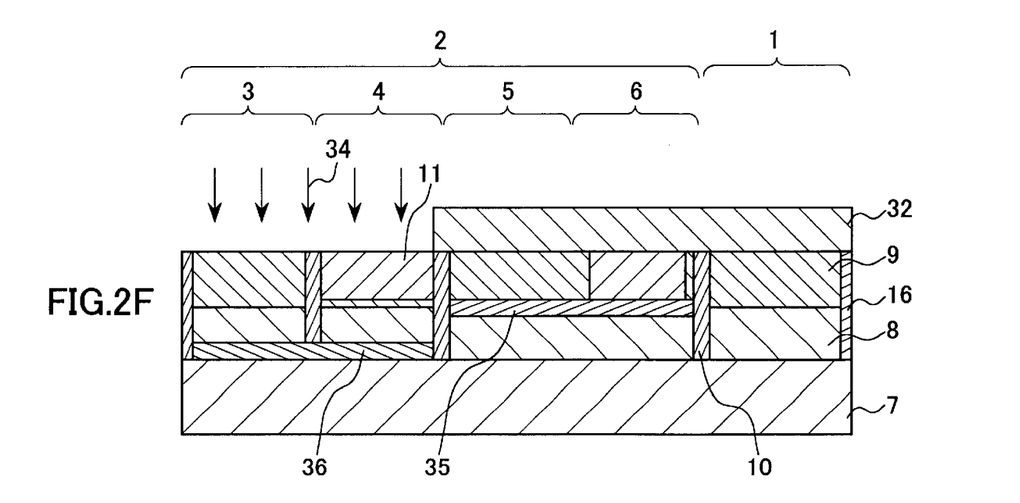

As shown in FIG. 2F, the first mask pattern 31 used for the first ion implantation 33 in FIG. 2E is removed selectively by oxygen plasma etching or the like. Then, a second mask pattern 32 is formed on the second conduction type layer 9 by a photoresist or the like. The second mask pattern 32 is provided with an opening for ion implantation into the entire NPN bipolar transistor 3 and PNP bipolar transistor 4 or into a portion of the bipolar transistors. A second ion implantation 34 is performed selectively with the second mask pattern 32 to form a second oxygen ion implanted region 36.

At this time, the acceleration energy of the second ion implantation 34 is set to be higher than that of the first ion implantation 33 so that the second oxygen ion implanted region 36 is formed at a different depth from the first oxygen ion implanted region 35, e.g., it is positioned deeper than the first oxygen ion implanted region 35. This allows the second oxygen ion implanted region 36 to be formed in both the semiconductor substrate 7 and the intrinsic semiconductor layer 8 or in the intrinsic semiconductor layer 8 alone.

Figure 2G:
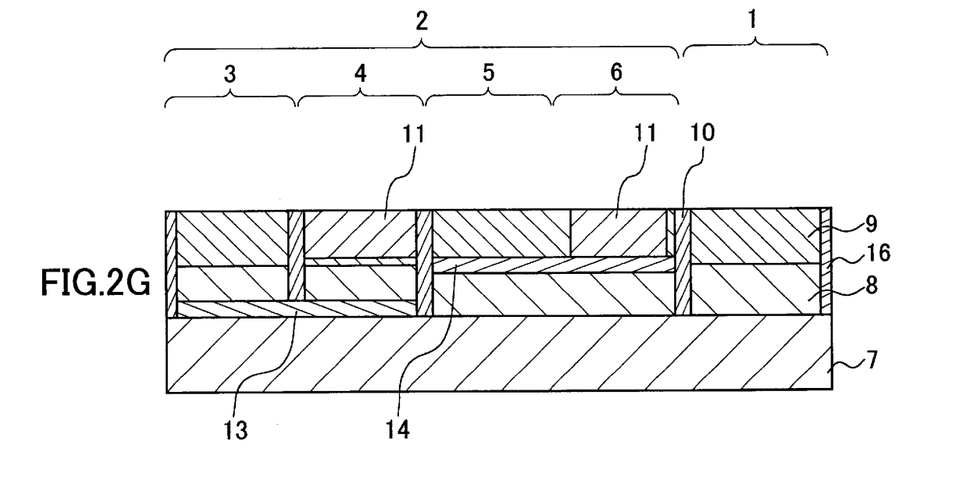

As shown in FIG. 2G, the second mask pattern 32 used for the second ion implantation 34 in FIG. 2F is removed selectively by oxygen plasma etching or the like. Then, the first insulator layer 13 and the second insulator layer 14 are formed respectively by changing the second and first oxygen ion implanted regions 36, 35 to silicon oxide films in the following manner: a heat treatment at a high temperature of about 1000° C. using inert gas such as argon gas is performed to cause the oxygen ion in the first oxygen ion implanted region 35 to react with the intrinsic semiconductor layer 8 and/or the second conduction type layer 9 and the oxygen ion in the second oxygen ion implanted region 36 to react with the semiconductor substrate 7 and/or the intrinsic semiconductor layer 8.

Figure 2H:
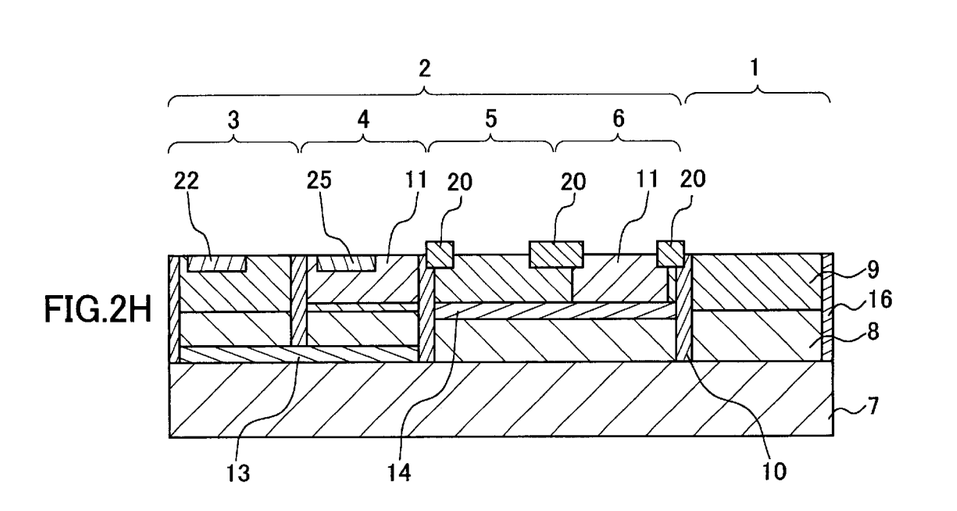

As shown in FIG. 2H, the base 22 of the NPN bipolar transistor 3 is formed by using boron as P-type impurities, and the base 25 of the PNP bipolar transistor 4 is formed by using phosphorus as N-type impurities. The insulator isolation portions 20 for separating the P-channel MIS transistor 5 and the N-channel MIS transistor 6 are formed with a silicon oxide film, e.g., by a LOCOS method.

Figure 2I:
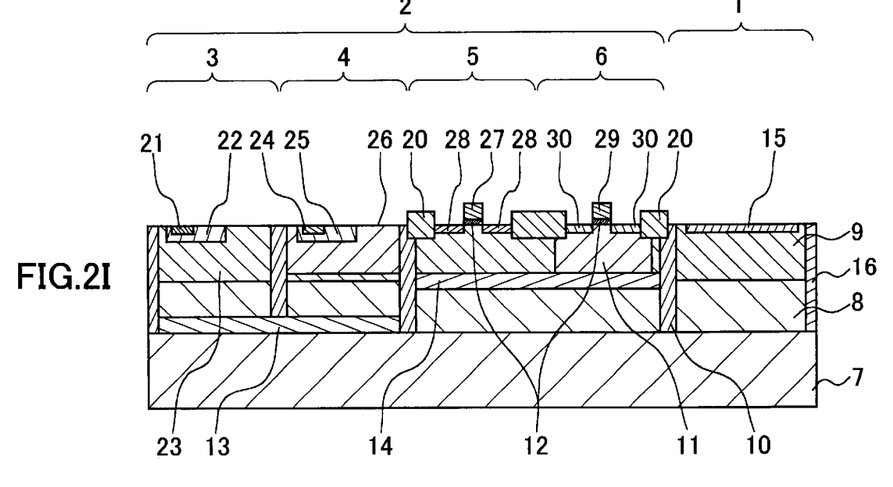

As shown in FIG. 2I, the emitter 21 of the NPN bipolar transistor 3 is formed by using phosphorus as N-type impurities, and the emitter 24 of the PNP bipolar transistor 4 is formed by using boron as P-type impurities. The source/drain 28 of the P-channel MIS transistor 5 is formed in the second conduction type layer 9 by using boron as P-type impurities. The gate insulating film 12 is formed with a silicon oxide film, on which the gate electrode 27 is formed with polycrystalline silicon that includes phosphorus as N-type impurities.

The source/drain 30 of the N-channel MIS transistor 6 is formed in the P-type impurity region 11 by using arsenic as N-type impurities. The gate insulating film 12 is formed with a silicon oxide film, on which the gate electrode 29 is formed with polycrystalline silicon that includes phosphorus as N-type impurities. Moreover, the second conduction type diffusion layer 15 is formed by using arsenic as N-type impurities.

Figure 2J:
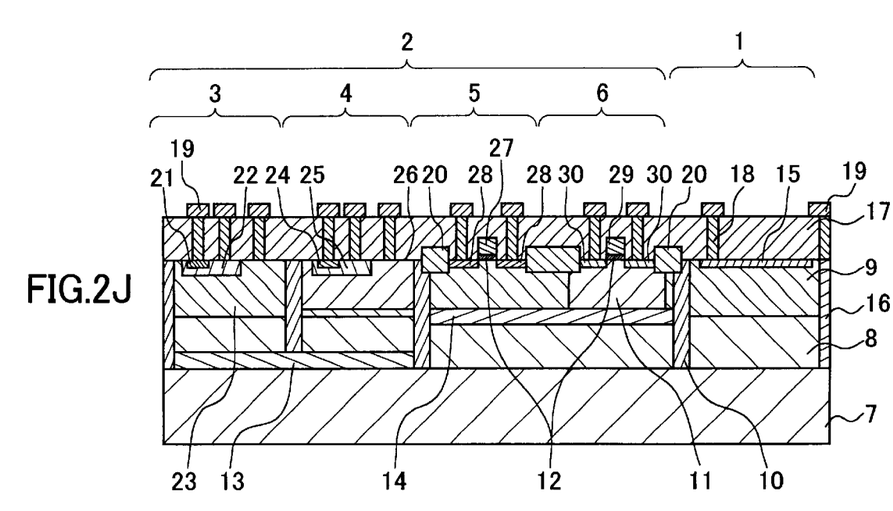

As shown in FIG. 2J, the interlayer insulating film 17 is formed with a silicon oxide film on the NPN bipolar transistor 3, the PNP bipolar transistor 4, the P-channel MIS transistor 5, the N-channel MIS transistor 6, and the photoelectric conversion portion 1 by CVD. Then, connection holes 18 are provided in the interlayer insulating film 17 by photoetching or the like. Finally, the aluminum electrodes 19 are formed, completing a photoelectric conversion device.

In Embodiment 1, the first insulator layer 13 and the second insulator layer 14 are formed respectively below the NPN and PNP bipolar transistors 3, 4 and the P- and N-channel MIS transistors 5, 6 at different depths, thereby improving the characteristics of each element. Specifically, this embodiment achieves the improved characteristics of each element in the following manner: the first insulator layer 13 is formed in a boundary portion of the semiconductor substrate 7 and the intrinsic semiconductor layer 8 for the bipolar transistors 3, 4 so as to suppress leakage between the bipolar transistors 3, 4 and the semiconductor substrate 7; the second insulator layer 14 is formed in a boundary portion of the intrinsic semiconductor layer 8 and the second conduction type layer 9 for the MIS transistors 5, 6 so as to prevent a formation of a parasitic transistor between the MIS transistors 5, 6 and the intrinsic semiconductor layer 8.

In the above manufacturing method, the first ion implantation 33 into the region below the MIS transistors 5, 6 is performed before the second ion implantation 34 into the region below the bipolar transistors 3, 4. However, it should be noted that the same characteristics can be obtained even if the second ion implantation 34 is performed first.

In this embodiment, the first insulator layer 13 and the second insulator layer 14 are made of silicon dioxide. However, it should be noted that the same effects can be obtained even if these insulator layers are made of an insulator such as silicon nitride.

Embodiment 2

Figure 3:
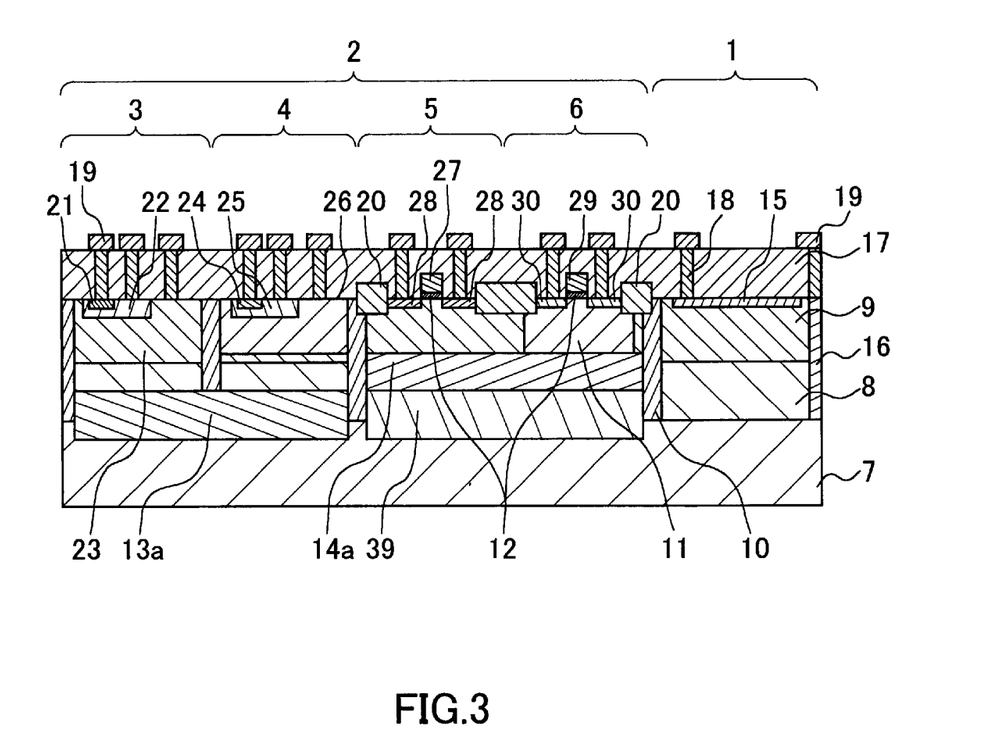
FIG. 3 is a cross-sectional view showing the configuration of a semiconductor device of Embodiment 2.

FIG. 3 shows a cross-sectional view showing a semiconductor device of Embodiment 2. The basic configuration of this semiconductor device is the same as that of the semiconductor device of Embodiment 1 illustrated in FIG. 1. Therefore, the identical elements to those in FIG. 1 are denoted by the same reference numerals, and the description will not be repeated.

This embodiment differs from the semiconductor device in FIG. 1 in a first insulator layer 13a, a second insulator layer 14a, and a third insulator layer 39.

The first insulator layer 13a is formed with a silicon oxide film below the NPN bipolar transistor 3 and the PNP bipolar transistor 4. The third insulator layer 39 is formed with a silicon oxide film below the P-channel MIS transistor 5 and the N-channel MIS transistor 6. The first insulator layer 13a and the third insulator layer 39 are formed in both the semiconductor substrate 7 and the intrinsic semiconductor layer 8 or may be formed in the intrinsic semiconductor layer 8 alone.

The second insulator layer 14a is formed with a silicon oxide film below the P-channel MIS transistor 5 and the N-channel MIS transistor 6. The second insulator layer 14a is formed continuously from the lower portion of the second conduction type layer 9, through the intrinsic semiconductor layer 8, and to the upper portion of the third insulator layer 39.

In the above semiconductor device, current generated by light entering the photoelectric conversion portion 1 is taken out of the cathode electrode 16, and then converted into a signal by a circuit that is formed as a combination of the NPN bipolar transistor 3, the PNP bipolar transistor 4, the P-channel MIS transistor 5, the N-channel MIS transistor 6, and the like.

Next, a method for manufacturing a semiconductor device having the above configuration will be described. Since the primary steps of this method are the same as those of the method illustrated in FIGS. 2A to 2D in Embodiment 1, the drawings and the explanation will be omitted. The subsequent steps will be described by referring to FIGS. 4A to 4F. FIGS. 4A to 4F are cross-sectional views showing the process flow.

Figure 4A:
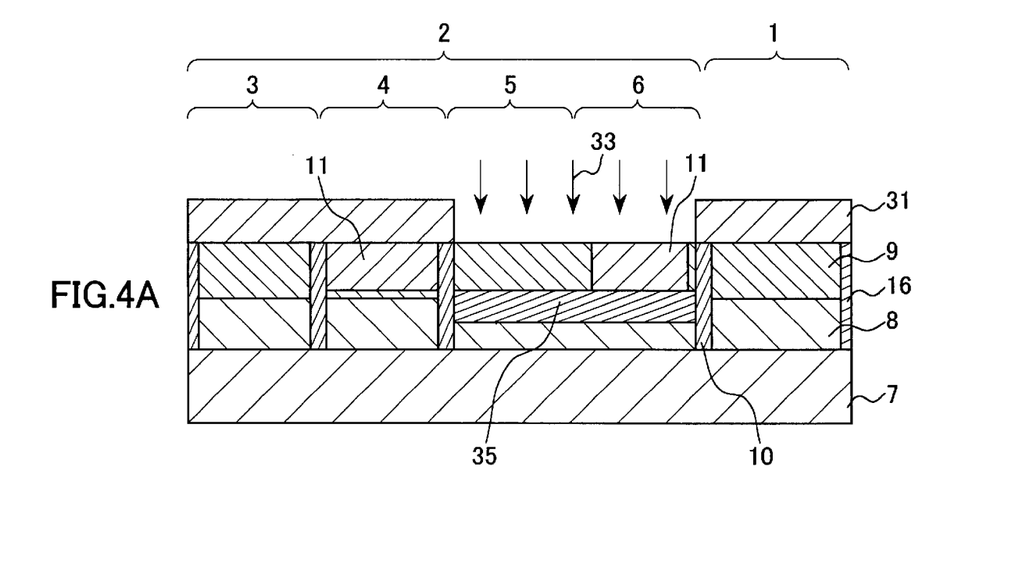
FIGS. 4A to 4F are cross-sectional views showing the process flow of a method for manufacturing the semiconductor device of Embodiment 2.

As shown in FIG. 4A, a first mask pattern 31 is formed on the second conduction type layer 9 by a photoresist or the like after the step in FIG. 2D. The first mask pattern 31 is provided with an opening for ion implantation into the entire P-channel MIS transistor 5 and N-channel MIS transistor 6 or into a portion of the MIS transistors. A first ion implantation 33 is performed selectively with the first mask pattern 31 to form a first oxygen ion implanted region 35. At this time, the acceleration energy of the first ion implantation 33 is adjusted so that the first oxygen ion implanted region 35 is formed in the intrinsic semiconductor layer 8 and the lower portion of the second conduction type layer 9.

Figure 4B:
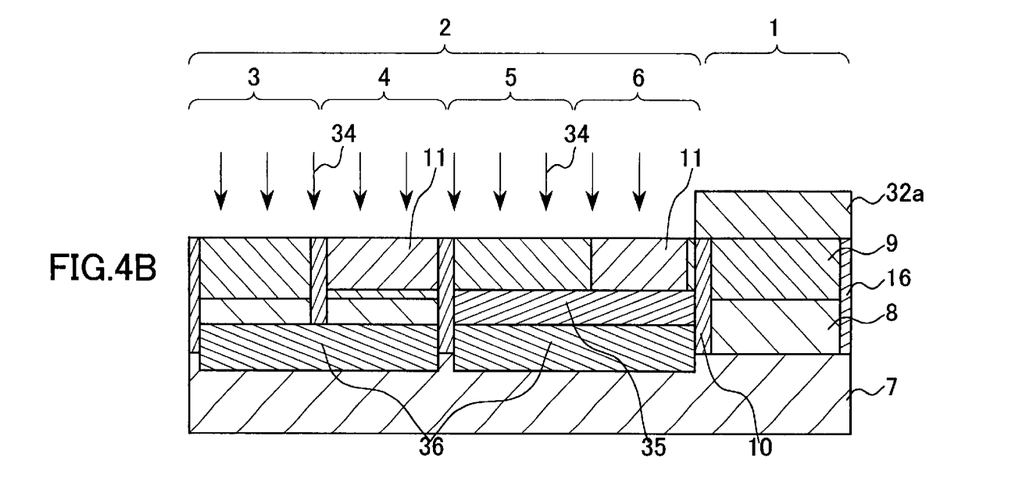

As shown in FIG. 4B, the first mask pattern 31 used for the first ion implantation 33 in FIG. 4A is removed selectively by oxygen plasma etching or the like. Then, a second mask pattern 32a is formed on the second conduction type layer 9 by a photoresist or the like. The second mask pattern 32a is provided with openings for ion implantation into the entire NPN bipolar transistor 3 and PNP bipolar transistor 4 or into a portion of the bipolar transistors and for ion implantation into the entire P-channel MIS transistor 5 and N-channel MIS transistor 6 or into a portion of the MIS transistors. A second ion implantation 34 is performed selectively with the second mask pattern 32a to form a second oxygen ion implanted region 36. At this time, the acceleration energy of the second ion implantation 34 is set to be higher than that of the first ion implantation 33 so that the second oxygen ion implanted region 36 is formed at a different depth from the first oxygen ion implanted region 35, e.g., it is positioned deeper than the first oxygen ion implanted region 35. This allows the second oxygen ion implanted region 36 to be formed in both the upper portion of the semiconductor substrate 7 and the intrinsic semiconductor layer 8 while adjoining the first oxygen ion implanted region 35.

Figure 4C:
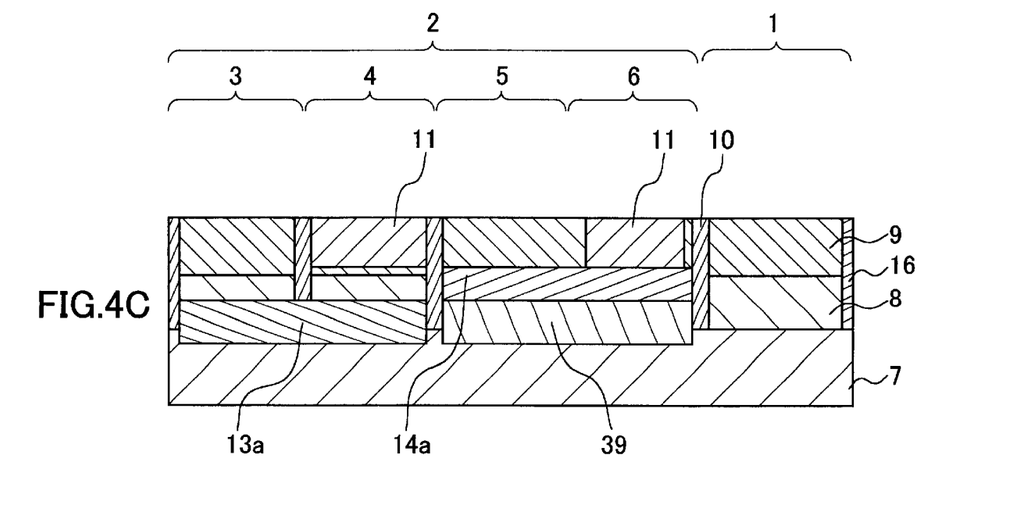

As shown in FIG. 4C, the second mask pattern 32a used for the second ion implantation 34 in FIG. 4B is removed selectively by oxygen plasma etching or the like. Then, the second insulator layer 14a, the first insulator layer 13a, and the third insulator layer 39 are formed respectively by changing the first and second oxygen ion implanted regions 35, 36 to silicon oxide films in the following manner: a heat treatment at a high temperature of about 1000° C. using inert gas such as argon gas is performed to cause the oxygen ion in the first oxygen ion implanted region 35 to react, e.g., with the intrinsic semiconductor layer 8 and/or the second conduction type layer 9 and the oxygen ion in the second oxygen ion implanted region 36 to react, e.g., with the semiconductor substrate 7 and/or the intrinsic semiconductor layer 8.

Figure 4D:
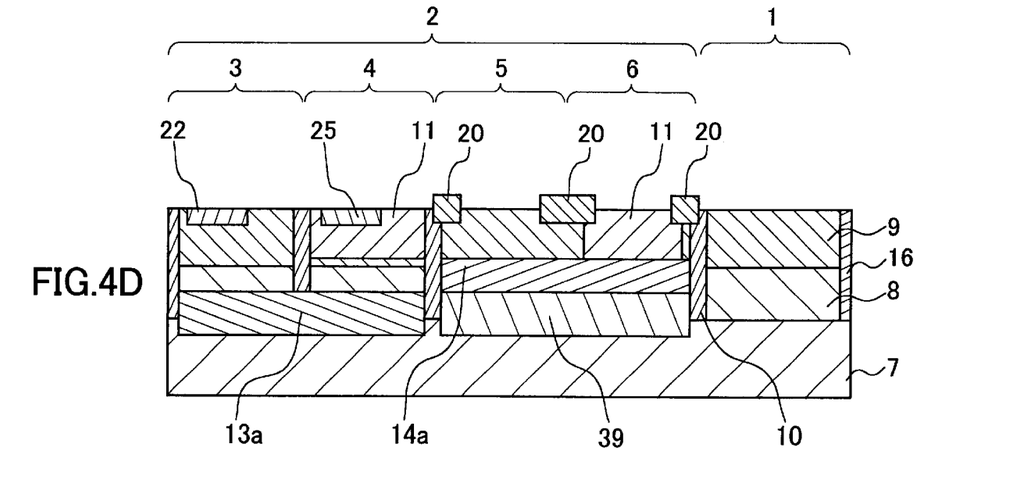

As shown in FIG. 4D, the base 22 of the NPN bipolar transistor 3 is formed by using boron as P-type impurities, and the base 25 of the PNP bipolar transistor 4 is formed by using phosphorus as N-type impurities. The insulator isolation portions 20 for separating the P-channel MIS transistor 5 and the N-channel MIS transistor 6 are formed with a silicon oxide film, e.g., by a LOCOS method.

Figure 4E:
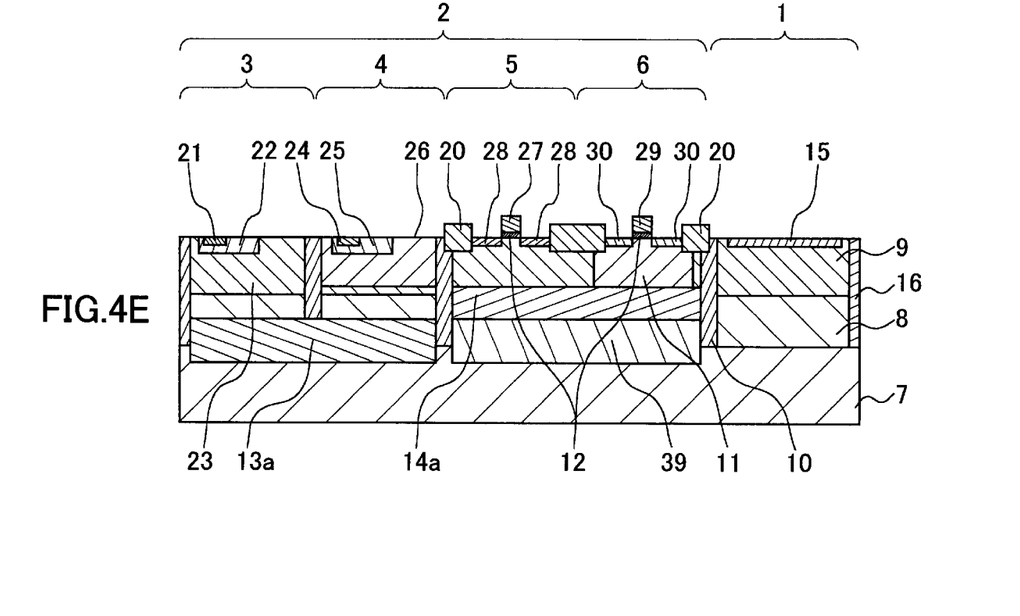

As shown in FIG. 4E, the emitter 21 of the NPN bipolar transistor 3 is formed by using phosphorus as N-type impurities, and the emitter 24 of the PNP bipolar transistor 4 is formed by using boron as P-type impurities. The source/drain 28 of the P-channel MIS transistor 5 is formed in the second conduction type layer 9 by using boron as P-type impurities. The gate insulating film 12 is formed with a silicon oxide film, on which the gate electrode 27 is formed with polycrystalline silicon that includes phosphorus as N-type impurities.

The source/drain 30 of the N-channel MIS transistor 6 is formed in the P-type impurity region 11 by using arsenic as N-type impurities. The gate insulating film 12 is formed with a silicon oxide film, on which the gate electrode 29 is formed with polycrystalline silicon that includes phosphorus as N-type impurities. Moreover, the second conduction type diffusion layer 15 is formed by using arsenic as N-type impurities.

Figure 4F:
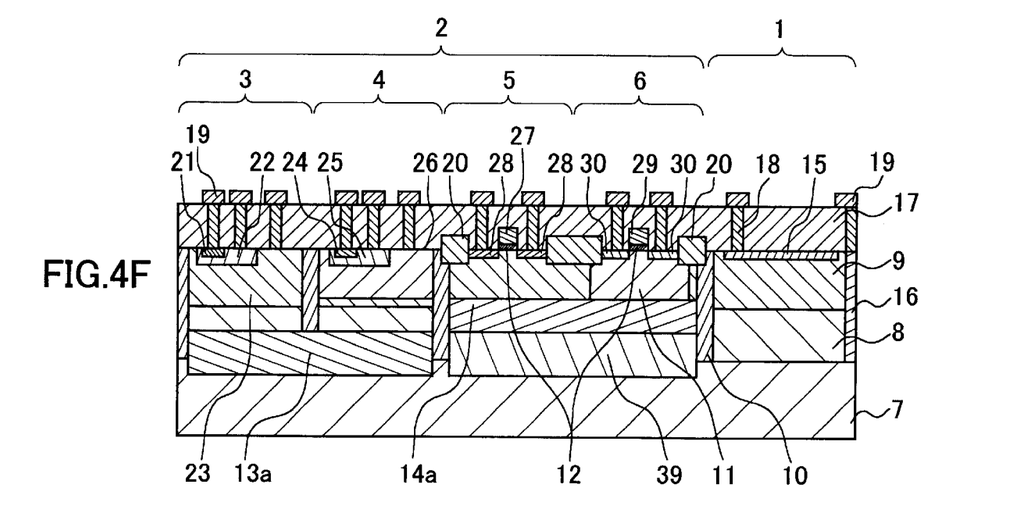

As shown in FIG. 4F, the interlayer insulating film 17 is formed with a silicon oxide film on the NPN bipolar transistor 3, the PNP bipolar transistor 4, the P-channel MIS transistor 5, the N-channel MIS transistor 6, and the photoelectric conversion portion 1 by CVD. Then, connection holes 18 are provided in the interlayer insulating film 17 by photoetching or the like. Finally, the aluminum electrodes 19 are formed, completing a photoelectric conversion device.

Embodiment 2 is characterized in that the second insulator layer 14a and the third insulator layer 39 are formed below the MIS transistors 5, 6, and the thickness of the insulator layers is larger than a thickness required for electrical insulation. In addition to the effect of electrical insulation, this embodiment can suppress the influence of electric potential from the semiconductor substrate 7 below the second insulator layer 14a upon the MIS transistors 5, 6, thereby improving the characteristics of each element.

The method of this embodiment makes it possible to form the first insulator layer 13a and the third insulator layer 39 simultaneously below the bipolar transistors 3, 4 and the MIS transistors 5, 6, thus contributing to a reduction in manufacturing cost.

Embodiment 3

A method for manufacturing a semiconductor device of Embodiment 3 will be described by referring to FIGS. 5A to 5D. FIGS. 5A to 5D are cross-sectional views showing the process flow.

Figure 5A:
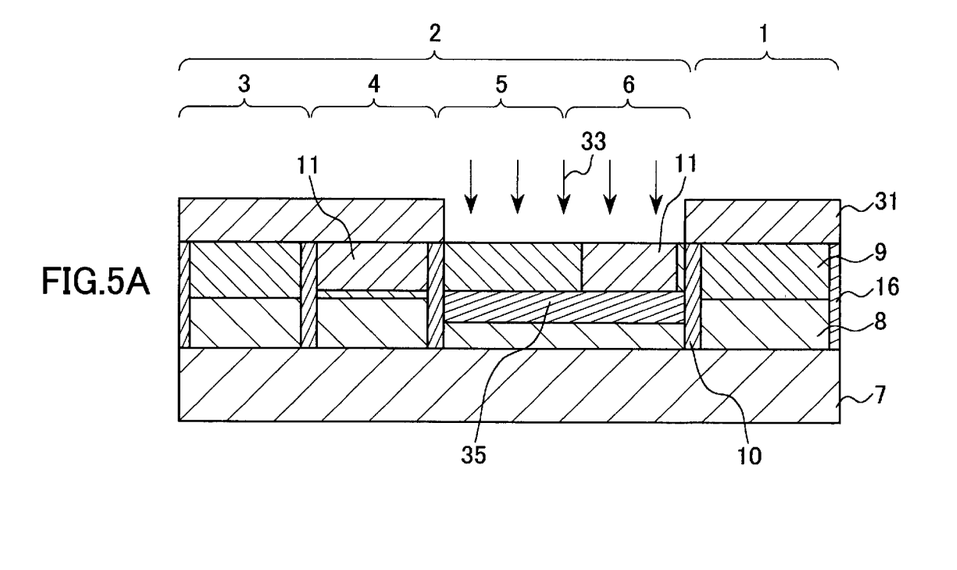
FIGS. 5A to 5D are cross-sectional views showing the process flow of a method for manufacturing a semiconductor device of Embodiment 3.

The step in FIG. 5A is the same as that illustrated in FIG. 4A in Embodiment 2. Therefore, an explanation of the steps before FIG. 5A will not be repeated.

Figure 5B:
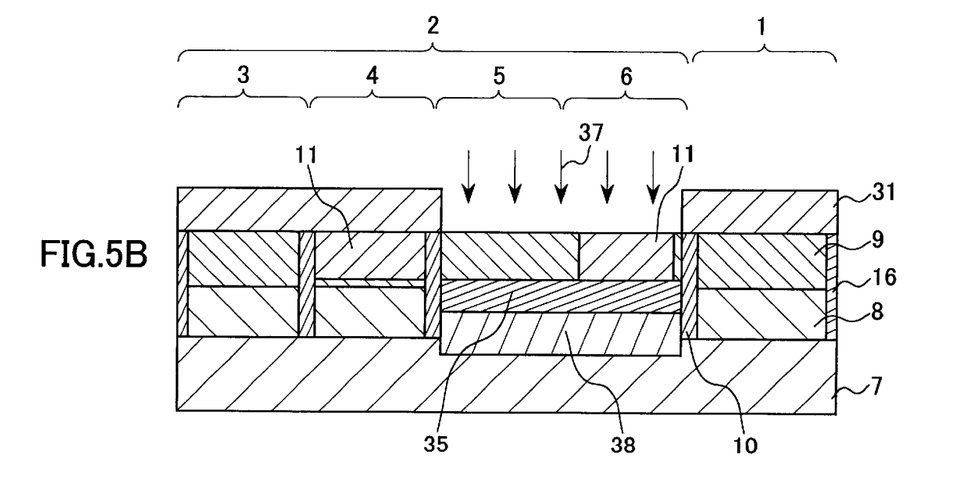

As shown in FIG. 5B, a third ion implantation 37 is performed to form a third oxygen ion implanted region 38 with the first mask pattern 31, which has been used for the first ion implantation 33 in FIG. 5A. At this time, the acceleration energy of the third ion implantation 37 is set to be higher than that of the first ion implantation 33 so that the third oxygen ion implanted region 38 is formed at a different depth from the first oxygen ion implanted region 35, e.g., it is positioned deeper than the first oxygen ion implanted region 35. This allows the third oxygen ion implanted region 38 to be formed in both the upper portion of the semiconductor substrate 7 and the intrinsic semiconductor layer 8 while adjoining the first oxygen ion implanted region 35.

Figure 5C:
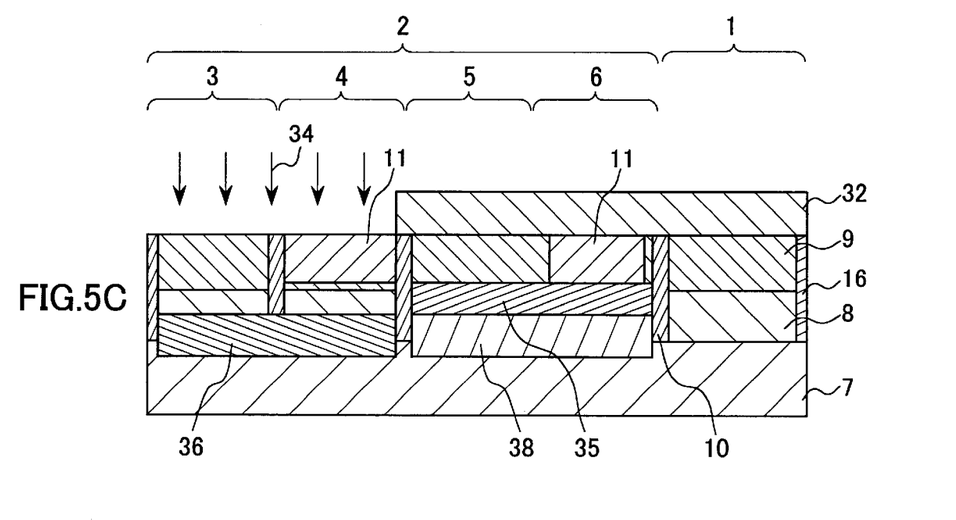

As shown in FIG. 5C, the first mask pattern 31 used for the third ion implantation 37 in FIG. 5B is removed selectively by oxygen plasma etching or the like. Then, a second mask pattern 32 is formed on the second conduction type layer 9 by a photoresist or the like. The second mask pattern 32 is provided with an opening for ion implantation into the entire NPN bipolar transistor 3 and PNP bipolar transistor 4 or into a portion of the bipolar transistors. A second ion implantation 34 is performed selectively with the second mask pattern 32 to form a second oxygen ion implanted region 36.

Figure 5D:
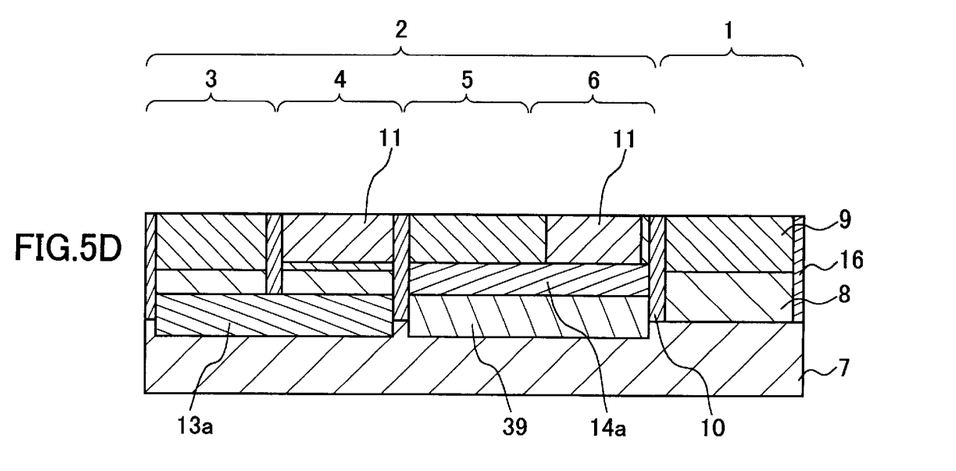

As shown in FIG. 5D, the second mask pattern 32 used for the second ion implantation 34 in FIG. 5C is removed selectively by oxygen plasma etching or the like. Then, the second insulator layer 14a, the first insulator layer 13a, and the third insulator layer 39 are formed respectively by changing the first, second, and third oxygen ion implanted regions 35, 36, 38 to silicon oxide films in the following manner: a heat treatment at a high temperature of about 1000° C. using inert gas such as argon gas is performed to cause the oxygen ion in the first oxygen ion implanted region 35 to react, e.g., with the intrinsic semiconductor layer 8 and/or the second conduction type layer 9, the oxygen ion in the second oxygen ion implanted region 36 to react, e.g., with the semiconductor substrate 7 and/or the intrinsic semiconductor layer 8, and the oxygen ion in the third oxygen ion implanted region 38 to react, e.g., with the semiconductor substrate 7 and/or the intrinsic semiconductor layer 8.

The subsequent steps are the same as those after FIG. 4D in Embodiment 2, and thus the explanation will not be repeated.

The method of Embodiment 3 makes it possible to form the insulator layers respectively below the MIS transistors 5, 6 and the bipolar transistors 3, 4, so that the characteristics of the individual elements can be controlled easily.

In Embodiments 2 and 3, the third insulator layer 39 is formed below the MIS transistors 5, 6. However, it should be noted that the same effect can be obtained even if the third insulator layer 39 is formed below the bipolar transistors 3, 4.

The configuration of a semiconductor device and a material or processing method for manufacturing the semiconductor device in each of the above embodiments should be taken as an example, and thus a generally accepted material or processing method equivalent to that disclosed can be employed. The configuration of a semiconductor device and a method for manufacturing the semiconductor device of the present invention can be applied even to a substrate having a laminated structure that includes layers with different conduction types, impurity concentrations and materials, as long as the uppermost layer of the substrate is the same as that of the semiconductor substrate of the present invention. This can provide the same effects as those described above.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
   a semiconductor substrate of a first conduction type;
   an intrinsic semiconductor layer of the first conduction type formed on the semiconductor substrate, the intrinsic semiconductor layer having a lower impurity concentration than that of the semiconductor substrate;
   a first semiconductor layer of a second conduction type formed on the intrinsic semiconductor layer;
   a first impurity layer of the first conduction type formed in the first semiconductor layer of the second conduction type; and
   a bipolar transistor and a MIS transistor formed in the first semiconductor layer of the second conduction type,
   the laminated structure of the semiconductor substrate, the intrinsic semiconductor layer, and the first semiconductor layer providing a diode for photoelectric conversion,
   wherein a first insulator layer is formed in at least a portion below the bipolar transistor and a second insulator layer is formed in at least a portion below the MIS transistor, and the first insulator layer is formed at a depth deeper than that of the second insulator layer.

2. The semiconductor device according to claim 1, further comprising a third insulator layer that adjoins a lower portion of one of the first insulator layer and the second insulator layer.

3. The semiconductor device according to claim 1, wherein the first insulator layer is formed in a region including the semiconductor substrate and the intrinsic semiconductor layer or only in the intrinsic semiconductor layer.

4. The semiconductor device according to claim 1, wherein the second insulator layer is formed in at least one of the intrinsic semiconductor layer and the first semiconductor layer.

5. The semiconductor device according to claim 1, wherein the first insulator layer is formed in a region including the semiconductor substrate and the intrinsic semiconductor layer or only in the intrinsic semiconductor layer, the second insulator layer is formed in a region including the intrinsic semiconductor layer and the first semiconductor layer or only in the intrinsic semiconductor layer, and the first insulator layer adjoins the second insulator layer.

6. The semiconductor device according to claim 1, wherein at least one of the first insulator layer and the second insulator layer is made of one selected from silicon dioxide and silicon nitride.

7. The semiconductor device according to claim 1, wherein the semiconductor substrate and the intrinsic semiconductor layer are made of silicon.

8. The semiconductor device according to claim 1, wherein the intrinsic semiconductor layer has an impurity concentration of $1 \times 10^{12}$ atms/cm$^3$ to $1 \times 10^{13}$ atms/cm$^3$.

9. The semiconductor device according to claim 1, wherein a thickness of at least one of the first insulator layer and the second insulator layer is larger than a thickness required for electrical insulation.

10. The semiconductor device according to claim 1, wherein the first insulator layer is formed in a boundary portion between the semiconductor substrate and the intrinsic semiconductor layer, and the second insulator layer is formed in a boundary portion between the intrinsic semiconductor layer and the second conduction type layer.

11. A method for manufacturing a semiconductor device comprising:

forming an intrinsic semiconductor layer of a first conduction type on a semiconductor substrate of the first conduction type, the intrinsic semiconductor layer having a lower impurity concentration than that of the semiconductor substrate;

forming a first semiconductor layer of a second conduction type on the intrinsic semiconductor layer;

forming a first impurity layer of the first conduction type in the first semiconductor layer of the second conduction type;

forming a bipolar transistor in a portion of the first semiconductor layer of the second conduction type, the bipolar transistor comprising a collector diffusion layer, a base diffusion layer, and an emitter diffusion layer; and forming a MIS transistor in a portion of the first semiconductor layer of the second conduction type, the MIS transistor comprising a source diffusion layer and a drain diffusion layer, the laminated structure of the semiconductor substrate, the intrinsic semiconductor layer, and the first semiconductor layer providing a diode for photoelectric conversion, wherein a first insulator layer is formed in at least a portion below the bipolar transistor and a second insulator layer is formed in at least a portion below the MIS transistor, and the first insulator layer is formed at a depth deeper than that of the second insulator layer.

12. The method according to claim 11, wherein a third insulator layer is formed so as to adjoin a lower portion of one of the first insulator layer and the second insulator layer.

13. The method according to claim 12, wherein the third insulator layer is formed by a process comprising a third ion implantation and heat treatment at high temperatures.

14. The method according to claim 12, wherein the third insulator layer is formed when forming the first insulator layer or the second insulator layer.

15. The method according to claim 11, wherein the first insulator layer is formed in a region including the semiconductor substrate and the intrinsic semiconductor layer or only in the intrinsic semiconductor layer.

16. The method according to claim 11, wherein the second insulator layer is formed in at least one of the intrinsic semiconductor layer and the first semiconductor layer.

17. The method according to claim 11, wherein the first insulator layer is formed by a process comprising a first ion implantation and heat treatment at high temperatures.

18. The method according to claim 17, wherein the heat treatment at high temperatures causes ions implanted in one of the first ion implantation, the second ion implantation, and the third ion implantation to react with at least one of the semiconductor substrate, the intrinsic semiconductor layer, and the first semiconductor layer.

19. The method according to claim 17, wherein a depth of the first ion implantation is adjusted so that the first insulator layer is formed in at least a portion of a region where the semiconductor substrate and the intrinsic semiconductor layer adjoin one another or only in the intrinsic semiconductor layer.

20. The method according to claim 11, wherein the second insulator layer is formed by a process comprising a second ion implantation and heat treatment at high temperatures.

21. The method according to claim 20, wherein a depth of the second ion implantation is adjusted so that the second insulator layer is formed in at least a portion of a region where the intrinsic semiconductor layer and the first semiconductor layer adjoin one another, only in the intrinsic semiconductor layer, or only in the first semiconductor layer.

22. The method according to claim 11, wherein the first insulator layer is formed in a region including the semiconductor substrate and the intrinsic semiconductor layer or only in the intrinsic semiconductor layer, the second insulator layer is formed in a region including the intrinsic semiconductor layer and the first semiconductor layer or only in the intrinsic semiconductor layer, and the first insulator layer adjoins the second insulator layer.

23. The method according to claim 11, wherein at least one of the first insulator layer and the second insulator layer is made of one selected from silicon dioxide and silicon nitride.

24. The method according to claim 11, wherein the semiconductor substrate and the intrinsic semiconductor layer are made of silicon.

25. The method according to claim 11, wherein the intrinsic semiconductor layer has an impurity concentration of $1 \times 10^{12}$ atms/cm$^3$ to $1 \times 10^{13}$ atms/cm$^3$.

26. The method according to claim 11, wherein a thickness of at least one of the first insulator layer and the second insulator layer is larger than a thickness required for electrical insulation.

* * * * *